United States Patent [19]

Ulmer

[11] Patent Number: 4,956,618

[45] Date of Patent: Sep. 11, 1990

[54] START-UP CIRCUIT FOR LOW POWER MOS CRYSTAL OSCILLATOR

[75] Inventor: Richard W. Ulmer, Tempe, Ariz.

[73] Assignee: VLSI Technology, Inc., San Jose, Calif.

[21] Appl. No.: 334,845

[22] Filed: Apr. 7, 1989

[51] Int. Cl.$^5$ ............................................. H03B 5/36
[52] U.S. Cl. .......................... 331/116 FE; 331/108 A; 331/108 L; 331/158
[58] Field of Search ............ 331/108 R, 108 A, 108 C, 331/116 FE, 116 R, 117 FE, 158

[56]  References Cited

U.S. PATENT DOCUMENTS 4,387,350  6/1983  Bessolo et al. ............... 331/116 FE

FOREIGN PATENT DOCUMENTS

| 0016151 | 2/1977 | Japan | 331/116 FE |
| 0021754 | 2/1977 | Japan | 331/116 FE |
| 0038248 | 4/1978 | Japan | 331/116 FE |
| 0116763 | 10/1978 | Japan | 331/116 FE |
| 2202106 | 12/1982 | Japan | 331/116 FE |
| 0024207 | 2/1983 | Japan | 331/116 FE |
| 0083403 | 5/1983 | Japan | 331/116 FE |
| 0214305 | 12/1984 | Japan | 331/116 FE |
| 0287702 | 12/1987 | Japan | 331/116 FE |
| 0005944 | 4/1979 | United Kingdom | 331/116 FE |

*Primary Examiner*—David Mis
*Attorney, Agent, or Firm*—LaValle D. Ptak

[57]  ABSTRACT

A CMOS crystal oscillator circuit for producing a 32 KHz clock signal operates at low power over a range of power supply voltages without overdriving the crystal. To accomplish this, the complementary MOS transistors in the oscillator inverter are supplied with operating current from a constant low current source. The constant low current is at an optimum value for crystal stability and power consumption and is independent of supply voltage variations. To ensure quick initial start-up of the oscillator circuit, a second current source is connected in parallel with the constant current source; and the second source initially is switched on for a pre-established time interval to supply significantly greater operating current to the oscillator inverter only during initial start-up of the oscillator. After this pre-established time interval, the second current source is rendered inoperative or non-conductive for the duration of the operation of the oscillator circuit.

18 Claims, 1 Drawing Sheet

START-UP CIRCUIT FOR LOW POWER MOS CRYSTAL OSCILLATOR

BACKGROUND

Complementary metal oxide semiconductor (CMOS) transistor devices currently are in widespread use in a variety of applications for low power electronic components. Low power CMOS oscillators are particularly popular for watches and the time/date clock circuits used in personal computers. For both of these applications, it is desirable to lower the power consumption of the electronic circuitry as much as possible to permit operation of such watches and clock circuits for long periods of time from batteries of small size and relatively low energy capacity. Popular circuits for attaining such desired results typically utilize an oscillator created using a CMOS inverter with a resonant circuit coupled between the output and input terminals. The resonant circuit, for electronic watches and computer clocks, also includes a quartz crystal operated at a resonant frequency of 32,768 Hz (approximately 32 KHz) to provide the time base. The output of the oscillator then is supplied to a processing circuit, including frequency dividers, to control a digital display or to drive a stepping motor (in the case of an analog watch) to produce the desired system output.

When a quartz crystal is operated at the relatively low frequency of 32 KHz, the physical construction of the crystal is somewhat fragile. Typically, the crystal is in the form of an elongated rod mounted at one end in a "tuning fork" configuration. The relatively long thin crystal rod requires precautions to be taken to prevent overdriving the crystal with too much power. If such a fragile crystal is overdriven, it is subject to permanent damage. In the case of electronic watches, the battery which is used to supply power to the circuitry typically has a voltage on the order of 1.2 volts. This voltage is sufficiently low that overdriving of the crystal is not possible. For computer internal clock applications, however, the standard direct current power supply typically is of the order of 4.5 to 5.5 volts; and in many currently available computer, a battery back-up supply of 1.8 to 3.5 volts also is available. The standard power supply voltage is sufficiently high that it is possible to overdrive the quartz crystal employed for the time base of the clock circuitry.

Efforts have been made to reduce the power consumption of CMOS oscillators to a point where such an oscillator used in a quartz watch, for example, is capable of operation for a number of years from a small, low-energy battery producing a 1.2 volt supply voltage. Circuits for minimizing the power consumption of CMOS crystal oscillators have been developed to obtain maximum voltage swings, while preventing the transistors of the oscillator circuit from achieving a full turn-on status. In some applications, this is accomplished by providing biasing voltages developed through the use of a current mirror, so that the biasing of the oscillator inverter transistors is independent of processing variables and ambient temperature. In other systems, current sources are connected in the gate circuitry of both of the inverter transistors also to provide an independent biasing of the transistors.

The systems of the type mentioned above usually operate only from a relatively low battery voltage (1.2 volts), so that no provisions are made to prevent to overdriving the crystal, since such overdriving is an impossibility with such low power circuits. If, for some reason, the power supply voltage were increased, there is nothing in such systems to prevent overdriving the crystal.

For applications operating 32 KHz crystal oscillators from higher voltage supplies, it typically has been the approach to utilize a voltage regulator to ensure that the voltage supplied to the CMOS crystal oscillator circuit is sufficiently low to prevent crystal overdriving. For computer applications or the like, typically a 5 volt power supply is employed. A voltage divider including an appropriate number of P-N series-connected diodes, Zener diodes or the like is employed to provide the regulated voltage to the circuit. Such voltage regulator circuits, however, require relatively large resistors, in order to limit power consumption and essentially only work with relatively high voltages (of the order of 5 volts or more). For the back-up battery power supply used for the clock/date circuits of microprocessors or personal computers, the back-up battery voltage usually is of 3 volts or less. If a circuit using a conventional voltage regulator is switched over to the power supply of such a low-voltage back-up battery, the available voltage for the system is too low for a conventional voltage divider voltage regulator. Thus, it is necessary to add additional amplification stages, and therefore increased complexity and cost, to achieve the desired results.

Another problem which exists with low power CMOS crystal oscillators operated at low frequencies (for example, 32 KHz, is that the start-up time for such oscillators is very slow, because of the limited gain/bandwidth of the amplifier inverter.) This condition is particularly aggravated at low voltages, and it is possible that oscillation start-up may not occur at all when a low power system initially is turned-on or powered up.

It is desirable to provide a low power CMOS crystal oscillator in which the gain/bandwidth of the inverter amplifier is increased during start-up and then is cut back to an optimized operating level to permit operation of the oscillator over a range of power supply voltages without overdriving the crystal.

In addition, it should be noted that prior art circuits which employ a voltage divider from a full 5 volt power supply in a clock/date oscillator circuit for a personal computer typically use between five and ten microamps of current for operation. It also is desirable to provide a circuit which achieves the same clock operation at significantly lower levels of power consumption.

SUMMARY OF THE INVENTION

In accordance with a preferred embodiment of this invention, a CMOS crystal oscillator circuit is provided with a constant low operating current during steady state operations. Increased current is provided during a pre-established period of time following initial start-up or power-up of the system, or when the system is rendered operative from a disabled state. This increased current allows the oscillator to attain stable operating conditions quickly.

DETAILED DESCRIPTION

Figure 1:
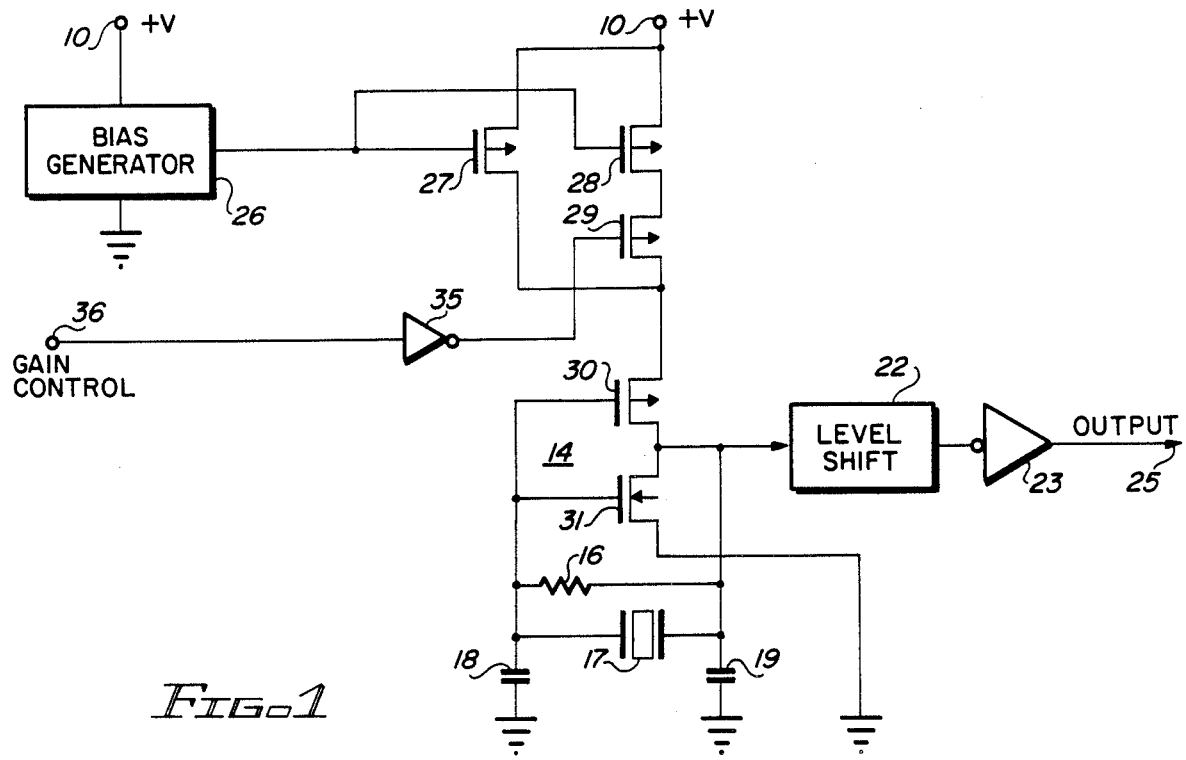
FIG. 1 is a schematic diagram of a preferred embodiment of the invention.

Reference now should be made to the drawing in which the same reference numbers are used in both figures to designate the same components.

FIG. 1 is a schematic diagram of a low frequency CMOS oscillator circuit incorporating the features of a preferred embodiment of this invention. The circuit of FIG. 1 is connected across a positive direct current operating voltage, which is applied between a positive supply voltage terminal 10 and ground. Steady state operating current for the oscillator circuit is supplied through a constant current source P-MOS transistor 27 connected in series with the supply voltage input of a CMOS oscillator inverter circuit 14. The inverter 14 comprises a P-MOS transistor 30 and an N-MOS transistor 31, the drains of which are connected together in common at the output terminal of the inverter 14 (the oscillator output) and the gates of which are connected together in common at the input terminal.

A gate bias resistance 16 of relatively large value (on the order of 10 megohms) is connected between the output and input terminals of the inverter 14 to limit losses between these terminals. A quartz crystal resonator 17 is connected in parallel with the resistance 16. For watches and for computer clock/date circuit operations, the crystal 17 is selected to resonate at 32,768 Hz. The oscillator circuit configuration then is completed by a pair of capacitors 18 and 19 connected between the opposite ends of the crystal 17 and ground. In CMOS circuits, an effective resistor for the resistance 16 often is formed by a conducting, very long channel MOS transistor, either N-channel or P-channel or both connected in parallel (transmission gate).

The oscillator configuration comprising the inverter 14 (including a pair of complementary MOS transistors 30 and 31), resistance 16, crystal 17, and the capacitors 18 and 19, is a configuration which currently is in relatively widespread use for watch and clock circuits. The output of the CMOS oscillator circuit then is supplied through a level shift circuit 22 of standard configuration and an amplifier 23 to an output terminal 25 where it is utilized in a conventional manner.

The gate of the constant current source transistor 27 is supplied with an operating bias voltage through a bias generator circuit 26, which may be of any standard configuration. The gate-to-source voltage on the gate of the transistor 27 remains constant in spite of variations in the change of the supply voltage across the positive supply terminal 10 and ground. The current supplied by the constant current source transistor 27 is on the order of one to three microamps; and this current remains constant over variations in the value of the direct current voltage on the terminal 10 over the normal operating range of the system, typically 1.8 volts to 5.5 volts.

Since the current supplied by the constant current source transistor 27 to the source-drain circuit path of the transistors 30 and 31 in the inverter 14 is so low, an additional current source is connected in parallel with the source-drain circuit of the transistor 27 to supply increased current to the amplifier circuit during start-up conditions. Without such increased current, start-up of the oscillator circuit illustrated in FIG. 1 can take as long as ten (10) seconds. In addition, there is a possibility that oscillation may not start at all, particularly for the low frequency (32 KHz) applications used in watch and computer time clock applications.

To provide an increase in the gain/bandwidth of the oscillator inverter amplifier 14 during initial circuit start-up, a second current source transistor 28 is connected with its source-drain path in series with the source-drain path of a switching MOS transistor 29 across the source-drain circuit of the constant low current source transistor 27. As illustrated in FIG. 1, the transistors 28 and 29 both are P-MOS transistors.

The gate of the transistor 28 is provided with bias from the bias generator circuit 26 in common with the bias supplied to the gate of the transistor 27. The physical characteristics of the transistors 27 and 28, however, differ, so that the transistor 28 supplies significantly more current to the oscillator inverter circuit 14 than does the transistor 27. Preferably the transistor 28 supplies current which is an order of magnitude greater than that supplied by the transistor 27. Consequently, if the transistor 27 supplies three microamps of current to the oscillator inverter 14 for steady state operation, the transistor 28 supplies 30 microamps during start-up operation of the circuit.

The transistor 29 is operated simply as an on/off switch to control the operation and non-operation of the current supplied to the inverter amplifier 14 by the transistor 28 in parallel with the transistor 27. The switching of the transistor 29 is effected through an amplifier 35 by a signal applied to a gain control input terminal 36. For typical applications, the signal on the terminal 36 is selected to bias the transistor 29 to its "on" state for some pre-established time interval at initial power up or start-up of the oscillator circuit of FIG. 1, or when the oscillator is to be enabled or started from a previous disabled state. After this time interval, which is selected to ensure proper oscillation is achieved by the oscillator circuit, the signal on the terminal 36 reverts to a steady state mode which biases the transistor 29 to its "off" state. This blocks any further current from being supplied to the oscillator circuit by the transistor 28. From this point on in the operation of the system, all of the steady state operating current then is supplied by the constant current source transistor 27 in the manner described above.

Figure 2:
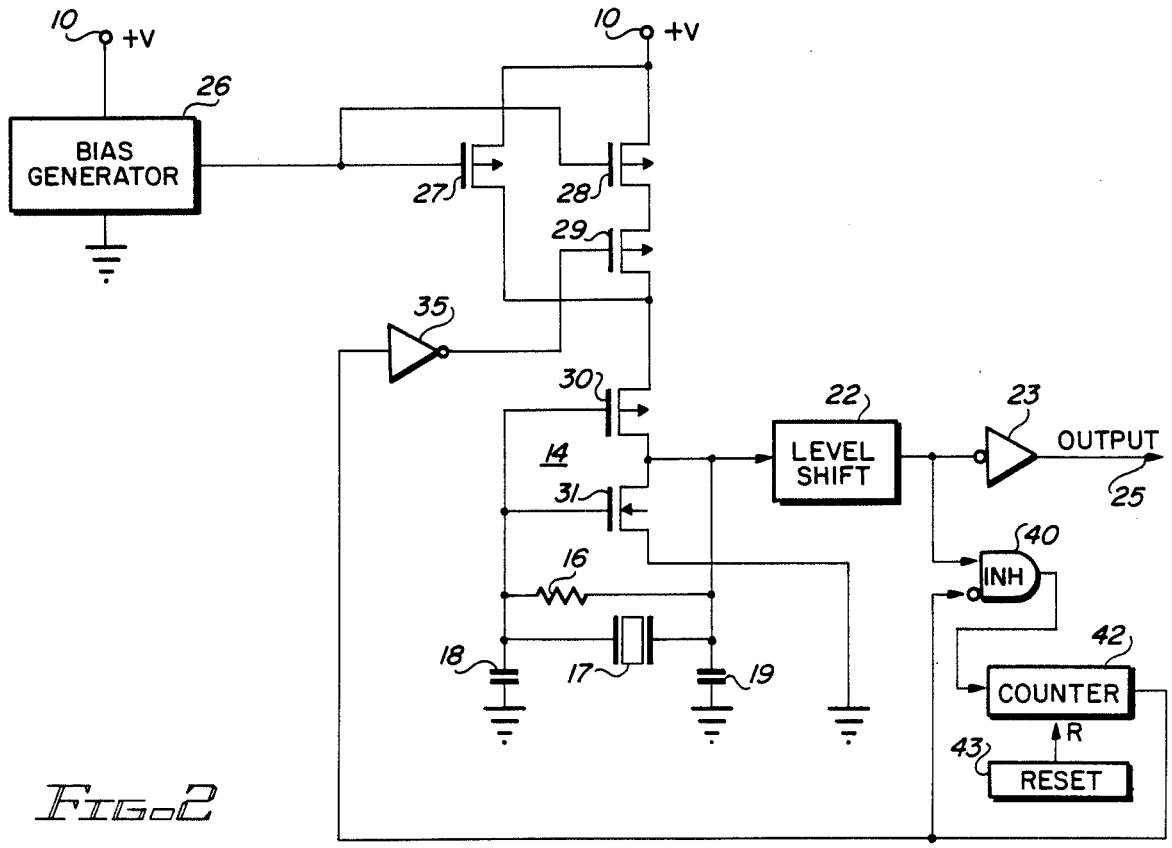
FIG. 2 is a schematic diagram of a specific implementation of the embodiment shown in FIG. 1.

FIG. 2 illustrates a manner in which the time interval for the signal applied to the gain control amplifier 35 may be established, based on the actual operating characteristics of the oscillator circuit itself. The circuit of FIG. 2 is substantially the same as the circuit of FIG. 1, except that the output of level shift circuit 22 is supplied to the input of an inhibit gate 40, as well as to the output amplifier 23. The output of the inhibit gate 40 then provides a pulse or count input to a standard digital counter 42. The counter 42 initially is set to a reset or zero count condition by a reset circuit 43. The reset signal from the circuit 43 typically is in the form of a pulse which is generated when the system first is powered up or turned-on, or whenever the oscillator is to be enabled after being placed in the disabled state of operation.

Assume now that the oscillator has been turned off and that the system is powered up. The bias generator 26 biases the transistors 27 and 28 into their respective conductive states. The reset pulse from the circuit 43 sets the counter 42 to its initial or zero count. At this time, the output from the counter 42 is applied through the amplifier 35 in the form of a bias signal which, when it is applied to the gate of the transistor 29, causes the transistor 29 to be turned on. This results in both of the current source transistors 27 and 28 supplying operating current to the source-drain circuit paths of the transistors 30 and 31 in the inverter amplifier 14. This is a maximum gain condition for triggering the crystal 17 into its stable oscillating condition as quickly as possible. Thus, the oscillator is operating at a relatively high power level.

This same output from the counter 42 is applied to the inhibit input of the inhibit gate 40 to enable pulses applied to the input of the gate 40 to pass through the gate to be counted by the counter 42. Thus, each oscillation of the oscillator circuit applied to the input of the level shift circuit 22 also results in a pulse passed through the inhibit gate 40 to the counter 42. After a pre-established number of these pulses have been counted by the counter 42, the output of the counter 42 changes state. This causes the transistor 29 to be rendered nonconductive, and the signal applied to the inhibit input of the inhibit gate 40 blocks the passage of further pulses by that gate from the level shift circuit 22. The system then operates in its steady state mode of operation. The gate 40 blocks passage of further pulses, and the transistor 29 remains turned off until the system once again is turned off and reset.

The number of pulses counted by the counter 42 is selected to represent an adequate number of cycles to indicate healthy oscillation by the oscillator circuit. The counter 42 disables itself through the inhibit gate 40 to minimize further power dissipation by the circuit, so that the system continues to operate in a low power mode of operation. Obviously, the number of pulses or cycles which are counted by the counter 42 may be varied in accordance with the particular operating conditions encountered by the circuit. Utilization of the circuit shown permits a reduction in the start-up time from near 10 (ten) seconds to a time of one (1) second or less. This is a desirable condition of operation and is achieved with a minimum number of additional components.

The timing function which is provided by the counter 42, also could be achieved by triggering a one-shot multi-vibrator into operation in response to the output of the power-on reset pulse from the circuit 43. An advantage to employing a counter, however, is that the output which finally disables or turns off the switching transistor 29 is based on an actual operating condition of the oscillator. When a one-shot multi-vibrator or other independent time out circuit is employed, the time out period is arbitrary and may not necessarily reflect the operation of the oscillator circuit itself.

The current which is supplied by the constant current transistor 27 is selected to be at an optimum value for crystal stability and low power consumption during the steady state operation of the system. Since this is a constant current source, switching of the power supply applied to the terminal 10 from a relatively high voltage to a lower back-up battery voltage does not change the operation of the circuit. By limiting the current supplied to the oscillator circuit through the constant current source transistor 27, lower power consumption for the entire circuit occurs, thereby preserving the life of the back-up battery (in the case of a computer when it is turned off or disconnected from the main power supply) or the battery used in a quartz crystal watch.

As an alternative to the parallel current sources 27 and 28 described above, the output of the counter 42 could be used to cause a change in the output of the bias generator 26 for controlling a single current source transistor (such as 27) to switch the current flow therethrough between a relatively high current at power-up and a lower operating current for the steady state operation of the system.

The foregoing description of the preferred embodiment of the invention should be taken as illustrative of the invention and not as limiting. Various changes and modifications will occur to those skilled in the art without departing from the true scope of the invention as defined in the appended claims.

I claim:

1. A low power MOS oscillator circuit including in combination:

first and second power supply terminals for connection to a source of operating power;

first and second complementary MOS transistors, the source-drain circuits of which are connected together in series;

resonant circuit means coupled between the drains and gates of said first and second MOS transistors;

first current source means including a first current source MOS transistor, the source-drain circuit of which is connected in series circuit with the source-drain circuits of said first and second MOS transistors between said first and second power supply terminals;

bias generator means coupled to the gate of said first current source transistor for causing a constant current flow of a predetermined amount therethrough;

second current source means connected in parallel with said first current source means and supplying more current than said first current source means; and means for selectively rendering said second current source means operative and non-operative.

2. The oscillator circuit according to claim 1 wherein said means means for selectively rendering said second current source means operative and non-operative causes said second current source means to be conductive for a predetermined time interval following initial start-up of the operation of said oscillator circuit.

3. The oscillator circuit according to claim 2 wherein the gates of said first and second MOS transistors are interconnected at a first common terminal and the drains of said first and second MOS transistors are interconnected at a second common terminal, with said resonant circuit means coupled between said first and second common terminals.

4. The oscillator circuit according to claim 3 wherein said resonant circuit means includes a quartz crystal connected between said first and second common terminals.

5. The oscillator circuit according to claim 4 wherein said means for selectively rendering said second current source means operative and non-operative includes time interval measuring means coupled with said second common terminal and responsive to output pulses on said second common terminal from said oscillator circuit.

6. The oscillator circuit according to claim 5 wherein said time interval measuring means comprises counter means for counting a predetermined number of pulses from the output of said oscillator circuit on said second terminal for producing a signal upon counting such predetermined number of pulses for rendering said second current source means non-conductive.

7. The oscillator circuit according to claim 6 wherein said first power supply terminal is connected to a source of positive voltage and said second power supply terminal is connected to ground, said first current source MOS transistor and said first complementary MOS transistor are P-type MOS transistors and said second complimentary MOS transistor is an N-type MOS transistor, with said first current source transistor, said P-type complementary MOS transistor, and said N-type complementary MOS transistor having the source-drain circuits thereof connected in series circuit, in the order named, between said first and second power supply terminals.

8. The oscillator circuit according to claim 7 wherein said second current source means includes a second current source MOS transistor, the source-drain circuit of which is connected in parallel with the source-drain circuit of said first current source MOS transistor.

9. The oscillator circuit according to claim 1 wherein the gates of said first and second MOS transistors are interconnected at a first common terminal and the drains of said first and second MOS transistors are interconnected at a second common terminal, with said resonant circuit means coupled between said first and second common terminals.

10. The oscillator circuit according to claim 9 wherein said resonant circuit means includes a quartz crystal connected between said first and second common terminals.

11. The oscillator circuit according to claim 10 wherein said means for selectively rendering said second current source means operative and non-operative causes said second current source means to be conductive for a predetermined time interval following initial start-up of the operation of said oscillator circuit.

12. The oscillator circuit according to claim 11 wherein said means for selectively rendering said second current source means operative and non-operative includes time interval measuring means coupled with said second common terminal and responsive to output pulses on said second common terminal from said oscillator circuit.

13. The oscillator circuit according to claim 12 wherein said time interval measuring means comprises counter means for counting a predetermined number of pulses from the output of said oscillator circuit on said second terminal for producing a signal upon counting such predetermined number of pulses for rendering said second current source means non-conductive.

14. The oscillator circuit according to claim 1 wherein said second current source means includes a second current source MOS transistor, the source-drain circuit of which is connected in parallel with the source-drain circuit of said first current source MOS transistor.

15. The oscillator circuit according to claim 14 wherein said means for selectively rendering said second current source means operative and non-operative comprises a switch means connected in series with the drain-source circuit of said second current source transistor, and further including means for causing said switch means to be conductive only for a predetermined time interval following initial start-up of said CMOS oscillator circuit and to be rendered non-conductive after said predetermined time interval.

16. A low power MOS oscillator circuit including in combination:
a source of operating power;
an MOS transistor oscillator circuit;
constant current source means connected in series circuit with said source of operating power and said oscillator circuit; and
control means for selectively rendering said current source means operative to supply first and second different amounts of constant current from said source of power to said oscillator circuit.

17. The oscillator circuit according to claim 16 wherein said second amount of constant current is greater than said first amount of constant current and said control means renders said constant current source means operative to supply said second amount of constant current for a predetermined time interval following initial start-up of said oscillator circuit.

18. The oscillator circuit according to claim 17 further including timing means connected to said control means and responsive to initial start-up of said oscillator circuit for establishing said predetermined time interval.

* * * * *